United States Patent
Rocklein et al.

(10) Patent No.: US 9,397,143 B2
(45) Date of Patent: Jul. 19, 2016

(54) LINER FOR PHASE CHANGE MEMORY (PCM) ARRAY AND ASSOCIATED TECHNIQUES AND CONFIGURATIONS

(71) Applicant: INTEL CORPORATION, Santa Clara, CA (US)

(72) Inventors: Noel Rocklein, Boise, ID (US); Qian Tao, Boise, ID (US); Zhe Song, Boise, ID (US); Vishwanath Bhat, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/137,864

(22) Filed: Dec. 20, 2013

(65) Prior Publication Data

US 2015/0179706 A1 Jun. 25, 2015

(51) Int. Cl.
H01L 27/24 (2006.01)
H01L 45/00 (2006.01)

(52) U.S. Cl.
CPC ............ H01L 27/2481 (2013.01); H01L 45/06 (2013.01); H01L 45/1233 (2013.01); H01L 45/141 (2013.01); H01L 45/16 (2013.01)

(58) Field of Classification Search
CPC ........................................................ H01L 45/06
USPC ............................................... 257/42; 438/95
See application file for complete search history.

(56) References Cited

U.S. PATENT DOCUMENTS

| | | | |
|---|---|---|---|
| 6,704,172 B2* | 3/2004 | Nishiyama et al. | 360/320 |
| 7,282,730 B2* | 10/2007 | Czubatyj et al. | 257/2 |
| 7,491,573 B1* | 2/2009 | Schrott et al. | 438/95 |
| 8,026,543 B2* | 9/2011 | Song et al. | 257/296 |
| 2006/0077741 A1 | 4/2006 | Wang et al. | |
| 2008/0102560 A1 | 5/2008 | Hamamjy et al. | |
| 2009/0078990 A1* | 3/2009 | Yasuda | 257/326 |
| 2011/0049465 A1 | 3/2011 | Nagashima | |
| 2012/0326560 A1* | 12/2012 | Yun | H03H 9/02047 310/313 B |
| 2013/0256624 A1 | 10/2013 | Kau | |
| 2013/0277640 A1 | 10/2013 | Nishimura et al. | |

OTHER PUBLICATIONS

Tomczak et al, "In Situ Reaction Mechanism Studies on Atomic Layer Deposition of AlxSiyOz from Trimethylaluminium, Hexakis(ethylamino)disilane, and Water," Chem. Mater., vol. 24, pp. 3859-3867 (2012).*
International Search Report and Written Opinion mailed Mar. 30, 2015, issued in corresponding International Application No. PCT/US2014/069280, filed Dec. 9, 2014, 11 pages.

* cited by examiner

*Primary Examiner* — Thao X Le
*Assistant Examiner* — Xia L Cross
(74) *Attorney, Agent, or Firm* — Schwabe, Williamson & Wyatt, P.C.

(57) ABSTRACT

Embodiments of the present disclosure describe a liner for a phase change memory (PCM) array and associated techniques and configurations. In an embodiment, a substrate, an array of phase change memory (PCM) elements disposed on the substrate, wherein individual PCM elements of the array of PCM elements comprise a chalcogenide material and a liner disposed on sidewall surfaces of the individual PCM elements, wherein the liner comprises aluminum (Al), silicon (Si) and oxygen (O). Other embodiments may be described and/or claimed.

7 Claims, 4 Drawing Sheets

LINER FOR PHASE CHANGE MEMORY (PCM) ARRAY AND ASSOCIATED TECHNIQUES AND CONFIGURATIONS

FIELD

Embodiments of the present disclosure generally relate to the field of integrated circuits, and more particularly, to a liner for a phase change memory (PCM) array and associated techniques and configurations.

BACKGROUND

Phase change memory (PCM) technology such as multi-stack cross-point PCM is a promising alternative to other non-volatile memory (NVM) technology. Presently, in cross-point array architecture, a protective liner may be formed on PCM elements of an array stack to prevent potential damage to the PCM elements during subsequent deposition of other materials such as a fill material deposited to fill areas between the PCM elements. However, present technologies of forming a protective liner may provide a liner that is susceptible to damage from subsequent processes, hinders filling of material between the PCM elements, fails to provide good adhesion for subsequent deposition of materials, fails to provide sufficient barrier properties to prevent thermal diffusion of materials from the PCM elements and/or may suffer from other deficiencies such as destructive deposition processes (e.g., high temperature) to form the liner.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure describe a liner for a phase change memory (PCM) array and associated techniques and configurations. In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations are described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous. The term "coupled" may refer to a direct connection, an indirect connection, or an indirect communication.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, state machine, and/or other suitable components that provide the described functionality.

Figure 1:
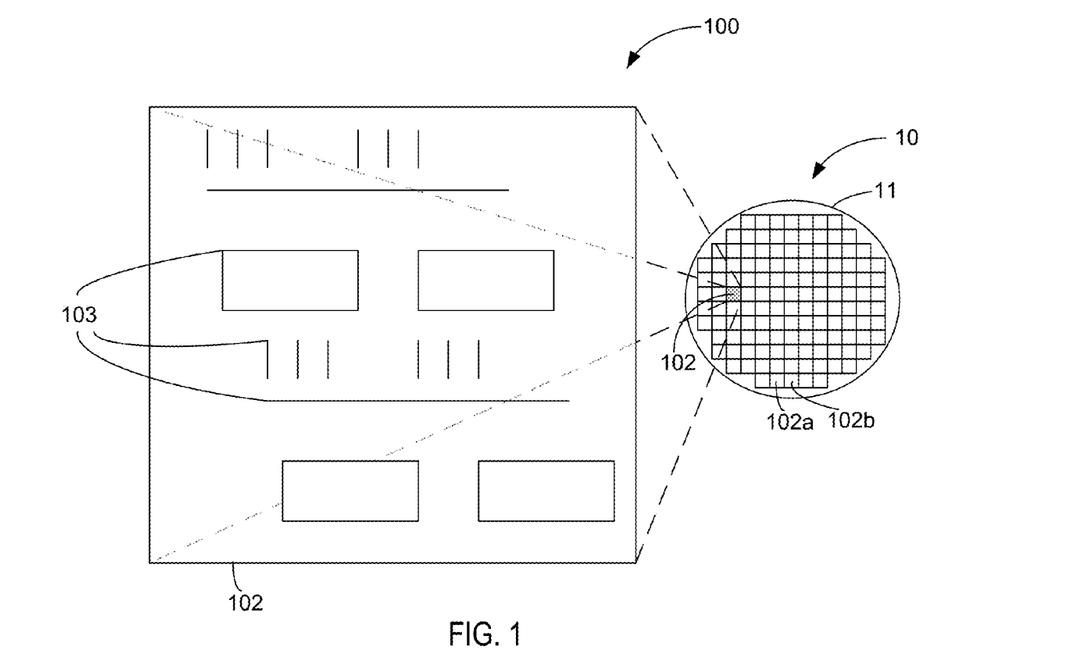
FIG. 1 schematically illustrates a top view of an example die in wafer form and in singulated form, in accordance with some embodiments.

FIG. 1 schematically illustrates a top view of an example die 102 in wafer form 10 and in singulated form 100, in accordance with some embodiments. In some embodiments, the die 102 may be one of a plurality of dies (e.g., dies 102, 102a, 102b) of a wafer 11 composed of semiconductor material such as, for example, silicon or other suitable material. The plurality of dies may be formed on a surface of the wafer 11. Each of the dies may be a repeating unit of a semiconductor product that includes phase change memory (PCM) elements having a liner as described herein. For example, the die 102 may include circuitry 103 of a PCM device in accordance with some embodiments. According to various embodiments, the circuitry 103 may include one or more PCM elements (e.g., cells), which may be configured in an array. The PCM elements may include, for example, a phase change material such as a chalcogenide glass that can be switched between crystalline and amorphous states with the application of heat produced by an electric current. The state (e.g., crystalline/amorphous) of the phase change material may correspond with a logical value (e.g., 1 or 0) of the PCM elements. The circuitry 103 may be part of a PCM and switch (PCMS) device in some embodiments. That is, the PCM elements may include a switch such as, for example, an ovonic threshold switch (OTS) configured for use in selection/programming operations of the PCM elements.

The circuitry 103 may further include one or more bit-lines and one or more word-lines coupled to the PCM elements. The bit-lines and word-lines may be configured such that each of the PCM elements is disposed at an intersection of each individual bit-line and word-line, in some embodiments. A voltage or bias can be applied to a target PCM element of the PCM elements using the word-lines and the bit-lines to select the target cell for a read or write operation. Bit-line drivers may be coupled to the bit-lines and word-line drivers may be coupled to the word-lines to facilitate decoding/selection of the PCM elements. Capacitors and resistors may be coupled to the bit-lines and the word-lines. The circuitry 103 may include other suitable devices and configurations in some embodiments. For example, the circuitry 103 may include one or more modules be configured to perform read, program, verify and/or analysis operations.

In some embodiments, the circuitry 103 may be formed using PCM fabrication techniques and/or other suitable semiconductor fabrication techniques. It is noted that the circuitry 103 is only schematically depicted in FIG. 1 and may represent a wide variety of suitable logic or memory in the form of circuitry including, for example, one or more state machines including circuitry and/or instructions in storage (e.g., firmware or software) configured to perform actions such as read, program, verify and/or analysis operations.

After a fabrication process of the semiconductor product is complete, the wafer 11 may undergo a singulation process in which each of the dies (e.g., dies 102, 102a, 102b) is separated from one another to provide discrete "chips" of the semiconductor product. The wafer 11 may be any of a variety of sizes. In some embodiments, the wafer 11 has a diameter ranging from about 25.4 mm to about 450 mm. The wafer 11 may include other sizes and/or other shapes in other embodiments. According to various embodiments, the circuitry 103 may be disposed on a semiconductor substrate in wafer form 10 or singulated form 100. In some embodiments, the die 102 may include logic or memory, or combinations thereof.

Figure 2:
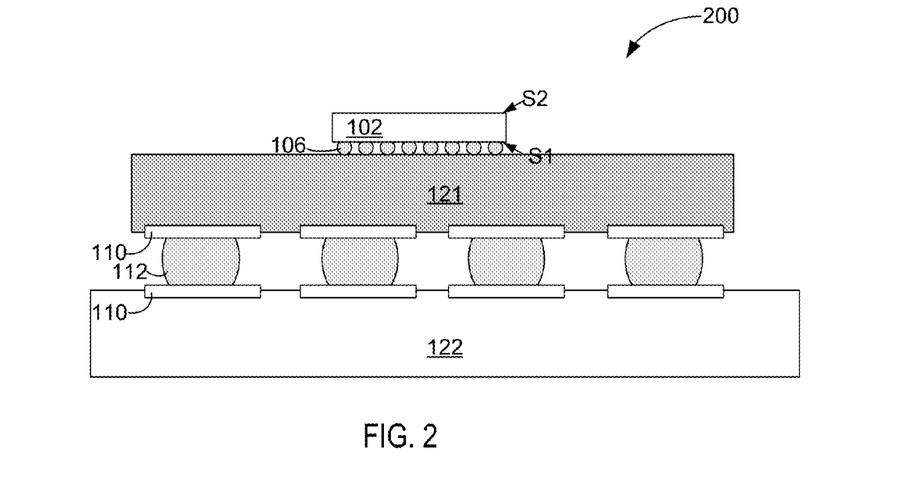
FIG. 2 schematically illustrates a cross-section side view of an integrated circuit (IC) assembly, in accordance with some embodiments.

FIG. 2 schematically illustrates a cross-section side view of an integrated circuit (IC) assembly 200, in accordance with some embodiments. In some embodiments, the IC assembly 200 may include one or more dies (hereinafter "die 102") electrically and/or physically coupled with a package substrate 121. The die 102 may include circuitry (e.g., circuitry 103 of FIG. 1) including PCM elements having a liner as described herein. In some embodiments, the package substrate 121 may be coupled with a circuit board 122, as can be seen.

The die 102 may represent a discrete product made from a semiconductor material (e.g., silicon) using semiconductor fabrication techniques such as thin film deposition, lithography, etching and the like used in connection with forming PCM devices. In some embodiments, the die 102 may be, include, or be a part of a processor, memory, system-on-chip (SoC) or ASIC in some embodiments. In some embodiments, an electrically insulative material such as, for example, molding compound or underfill material (not shown) may encapsulate at least a portion of the die 102 and/or die-level interconnect structures 106.

The die 102 can be attached to the package substrate 121 according to a wide variety of suitable configurations including, for example, being directly coupled with the package substrate 121 in a flip-chip configuration, as depicted. In the flip-chip configuration, an active side, S1, of the die 102 including active circuitry is attached to a surface of the package substrate 121 using die-level interconnect structures 106 such as bumps, pillars, or other suitable structures that may also electrically couple the die 102 with the package substrate 121. The active side S1 of the die 102 may include circuitry such as, for example, PCM elements. An inactive side, S2, may be disposed opposite to the active side S1, as can be seen. In other embodiments, the die 102 may be disposed on another die that is coupled with the package substrate 121 in any of a variety of suitable stacked die configurations. For example, a processor die may be coupled with the package substrate 121 in a flip-chip configuration and the die 102 may be mounted on the processor die in a flip-chip configuration and electrically coupled with the package substrate using through-silicon vias (TSVs) formed through the processor die. In still other embodiments, the die 102 may be embedded in the package substrate 121 or coupled with a die that is embedded in the package substrate 121. Other dies may be coupled with the package substrate 121 in a side-by-side configuration with the die 102 in other embodiments.

In some embodiments, the die-level interconnect structures 106 may be configured to route electrical signals between the die 102 and the package substrate 121. The electrical signals may include, for example, input/output (I/O) signals and/or power/ground signals that are used in connection with operation of the die. The die-level interconnect structures 106 may be coupled with corresponding die contacts disposed on the active side S1 of the die 102 and corresponding package contacts disposed on the package substrate 121. The die contacts and/or package contacts may include, for example, pads, vias, trenches, traces and/or other suitable contact structures.

In some embodiments, the package substrate 121 is an epoxy-based laminate substrate having a core and/or build-up layers such as, for example, an Ajinomoto Build-up Film (ABF) substrate. The package substrate 121 may include other suitable types of substrates in other embodiments including, for example, substrates formed from glass, ceramic, or semiconductor materials.

The package substrate 121 may include electrical routing features configured to route electrical signals to or from the die 102. The electrical routing features may include, for example, package contacts (e.g., pads 110) disposed on one or more surfaces of the package substrate 121 and/or internal routing features (not shown) such as, for example, trenches, vias or other interconnect structures to route electrical signals through the package substrate 121.

The circuit board 122 may be a printed circuit board (PCB) composed of an electrically insulative material such as an epoxy laminate. For example, the circuit board 122 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Interconnect structures (not shown) such as traces, trenches, vias may be formed through the electrically insulating layers to route the electrical signals of the die 102 through the circuit board 122. The circuit board 122 may be composed of other suitable materials in other embodiments. In some embodiments, the circuit board 122 is a motherboard (e.g., motherboard 502 of FIG. 5).

Package-level interconnects such as, for example, solder balls 112 may be coupled to pads 110 on the package substrate 121 and/or on the circuit board 122 to form corresponding solder joints that are configured to further route the electrical signals between the package substrate 121 and the circuit board 122. The pads 110 may be composed of any suitable electrically conductive material such as metal including, for example, nickel (Ni), palladium (Pd), gold (Au), silver (Ag), copper (Cu), and combinations thereof. The package-level interconnect may include other structures and/or configurations including, for example, land-grid array (LGA) structures and the like.

The IC assembly 200 may include a wide variety of other suitable configurations in other embodiments including, for example, suitable combinations of flip-chip and/or wire-bonding configurations, interposers, multi-chip package configurations including system-in-package (SiP) and/or package-on-package (PoP) configurations. Other suitable techniques to route electrical signals between the die 102 and other components of the IC assembly 200 may be used in some embodiments.

Figure 3:
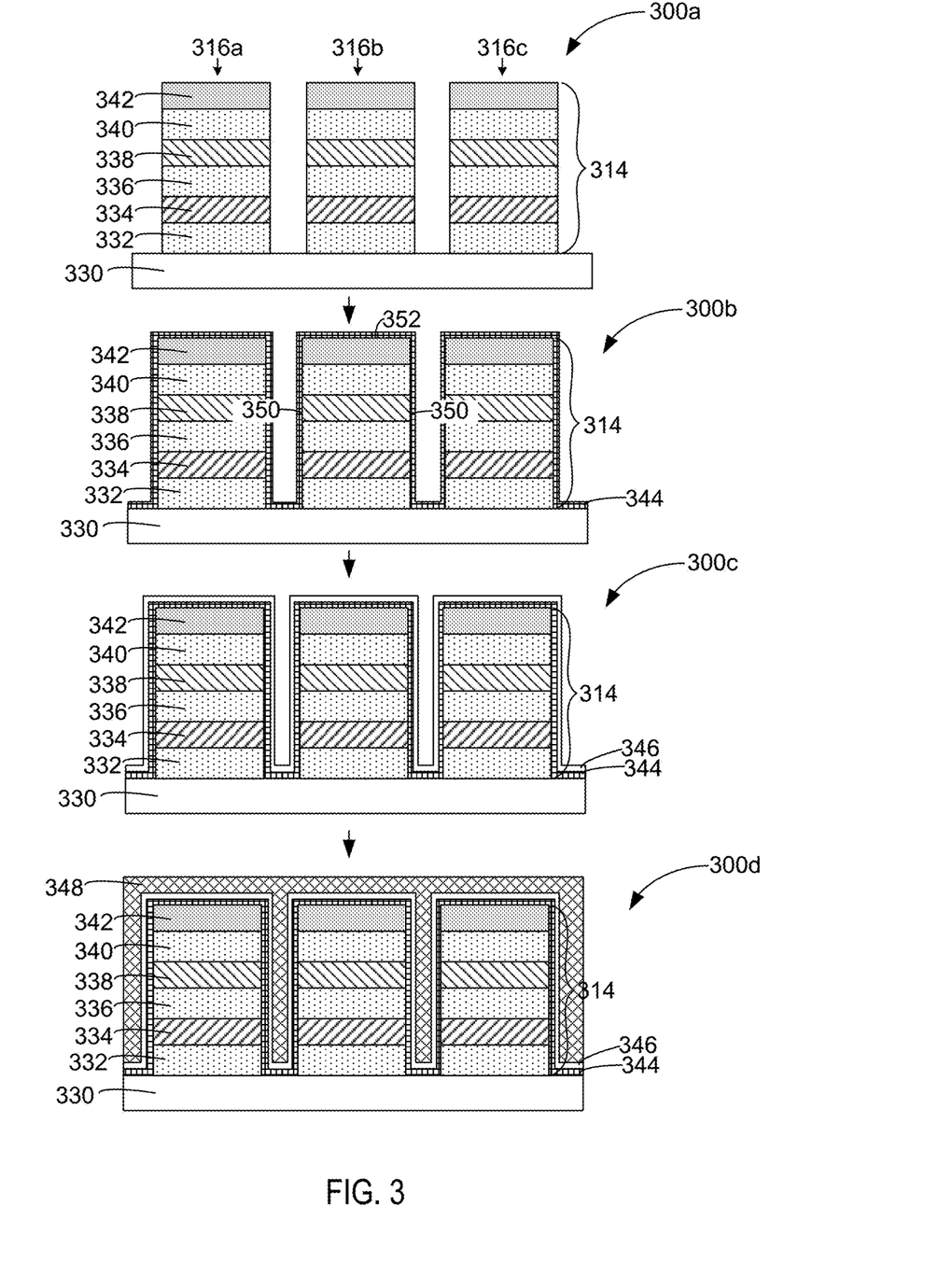
FIG. 3 schematically illustrates a cross-section side view of a phase change memory (PCM) device during various stages of fabrication, in accordance with some embodiments.

FIG. 3 schematically illustrates a cross-section side view of a PCM device during various stages of fabrication, in accordance with some embodiments. According to various embodiments, a PCM device 300a is depicted subsequent to forming an array of PCM elements 316a, 316b, 316c on an underlying layer such as, for example, wordline (WL) layer 330. The PCM elements 316a, 316b, 316c may be formed on other suitable underlying layers in other embodiments such as, for example, a bitline layer. The PCM device 300a may be formed on a substrate such as, for example, a semiconductor substrate (e.g., semiconductor substrate of die 102). Although not shown, one or more other structures and/or layers may be disposed between the PCM device 330a and the substrate. The PCM elements 316a, 316b, 316c may represent PCM cells. Although only three PCM elements 316a, 316b, 316c are depicted in FIG. 3, the PCM device 300a may include other suitable numbers of PCM elements in various embodiments.

In some embodiments, each of the PCM elements 316a, 316b, 316c is composed of a stack 314 of layers. For example, the stack 314 of layers may include a first layer 332, a second layer 334, a third layer 336, a fourth layer 338 and a fifth layer 340. The first layer 332, the third layer 336 and the fifth layer 340 may each comprise carbon and be referred to as a "carbon layer." The first layer 332, the third layer 336 and the fifth layer 340 may serve as electrodes and may include additional materials such as, for example, platinum (Pt), gold (Au) and the like in various embodiments. The second layer 334 and fourth layer 338 may each comprise a chalcogenide material and be referred to as a "chalcogenide layer." In some embodiments, the chalcogenide material of the second layer 334 and fourth layer 338 may be chemically different. In some embodiments, the stack 314 of layers may include a sixth layer 342 such as, for example, a hardmask layer used to pattern the stack 314 of layers to provide individual PCM elements of the array of PCM elements 316a, 316b, 316c. According to various embodiments, the hardmask layer may comprise silicon nitride or any other suitable patterning layer. The stack 314 of layers may include more or fewer layers or additional intervening layers between the layers 332, 334, 336, 338, 340, 342 in some embodiments.

The PCM device 300b may represent the PCM device 300a subsequent to forming a liner 344 on the PCM elements 316a, 316b, 316c. According to various embodiments, the liner 344 may function as a protective barrier for the PCM elements 316, 316b, 316c and/or an adhesion layer to facilitate adhesion of subsequent materials deposited on the liner 344. For example, the liner 344 may prevent thermal diffusion of materials from the layers 332, 334, 336, 338, 340, 342 of the PCM elements 316a, 316b, 316c.

As can be seen, the liner 344 may be disposed on sidewall surfaces 350 of the individual PCM elements 316a, 316b, 316c (e.g., directly on material of the layers 332, 334, 336, 338, 340, 342) and may be configured to cover the sidewall surfaces 350 entirely in some embodiments. In some embodiments, the liner 344 may be further disposed on a top surface 352 of the PCM elements 316a, 316b, 316c to cover the top surface 352. The liner 344 may be conformally deposited on exposed surfaces of the PCM device 300b such as surfaces of the PCM elements 316a, 316b, 316c and surfaces of the wordline layer 330 between the PCM elements 316a, 316b, 316c. In some embodiments, the liner 344 may have a substantially uniform thickness.

In some embodiments, the liner 344 comprises aluminum (Al), silicon (Si) and oxygen (O). For example, the liner 344 may be composed of aluminum silicon oxide ($Al_xSi_yO_z$) where x, y and z represent suitable relative quantities of Al, Si and O, respectively. In some embodiments, $y/(x+y)$ has a value from 0.05 to 0.6. The value z may be calculated according to the following, in some embodiments, $z=1.5x+2y$. Other suitable materials and/or ranges of x, y and z may be used in other embodiments. For example, in some embodiments, the deposited Al, Si and O may be further combined with other suitable elements such as, for example, carbon (C) or nitrogen (N) to form AlSiOC and/or AlSiON, or combinations thereof, and the like.

The liner 344 may be deposited using, for example, atomic layer deposition (ALD) or chemical vapor deposition (CVD). In some embodiments, a liner 344 comprising aluminum silicon oxide ($Al_xSi_yO_z$) may be deposited by a water-based (e.g., water used as oxidizer) ALD process performed at a temperature less than 250° C. Forming a liner 344 at a temperature below 250° C. may reduce or prevent damage to the chalcogenide material of the PCM elements 316a, 316b, 316c, which may occur at elevated temperatures. Using a water-based process may reduce or prevent damage to the liner 344 and other exposed materials, which may be caused by ozone or other oxidizers stronger than water. In other embodiments, a CVD process below 250° C. may be performed to form the liner 344 using, for example, direct or remote plasma.

For example, a $TMA/purge/H_2O/purge$ (TMA=trimethyl aluminum) ALD process may facilitate a $3DMAS/purge/H_2O/purge$ (3DMAS=tris-dimethylamine silane) process to form the liner 344 according to the reactions described in Equations 1-4 below, where * indicates a surface functional group. 3DMAS may be a Si precursor. In the reactions, $TMA/H_2O$ is used to form a hydroxylated seed layer (e.g., Al—OH*) to facilitate 3DMAS chemisorption to form Al—O—Si—N(CH$_3$)$_2$* surface species. Some or all of these surface species may then react with subsequent $H_2O$ surface exposure to create additional surface hydroxyl groups (Si—OH*).

[1a]

[1b]

[2a]

[2a]

[2c]

[2d]

[3a]

[3b]

[3c]

[4a]

[4b]

Regardless of an exact chemistry used, ALD cycling of mixed materials can be used to form the liner 344 according to various embodiments. For example, ALD may be performed according to Equation [5], where N, n, m are integer variables that can be adjusted to affect total thickness and composition of the liner:

$$N[n(\text{TMA/purge/H}_2\text{O/purge}) + m(\text{3DMAS/purge/H}_2\text{O/purge})] \quad [5]$$

A deposition rate of the liner 344 according to some or all of the reactions of Equations 1-4 may decrease with higher silicon content in the liner 344, which may be caused by a "poisoning effect" from accumulating —Si—O—Si— or —O—Si—H surface groups, which may be less reactive than —Al—OH or —Si—OH surface groups to subsequent TMA or 3DMAS surface exposures, which may hinder continuous ALD films of pure $SiO_2$. Application of an ALD metal-metal-oxidizer (MMO) scheme such as TMA-3DMAS-$H_2O$ may facilitate higher deposition rate of the liner 344 at higher silicon content. In some embodiments, the liner 344 formed according to these techniques may increase (e.g., double) an etch rate of the liner 344 relative to an etch rate of other liner materials. Additionally, the liner 344 may have a lower dielectric constant relative to other liner materials, which may reduce parasitic leakage such as, for example, WL-WL parasitic capacitance. Silicon content of a liner 344 comprising aluminum silicon oxide ($Al_xSi_yO_z$) formed by ALD may be tuned by adjusting an ALD cycle ratio. In some embodiments, the ALD may have a cycle ratio n:m of 1:3 (per equation 5, where n represents the number of TMA/purge/$H_2O$/purge cycles and m represents the number of 3DMAS/purge/$H_2O$/purge cycles). In some embodiments, the ALD may have a cycle ratio n:m of more than 1:3 or less than 1:3. Other suitable reactions or materials may be used to form the liner 344 in other embodiments. For example, in some embodiments, the silicon precursors may include 4DMAS (tetra-dimethylamino silane), 2DMAS (bis-dimethylamino silane), other amide-based silane precursors (e.g., bis-diethylamino silane) or other suitable precursors. The liner 344 may be deposited using other suitable techniques in other embodiments. In some embodiments, material of the liner 344 may be deposited to fill areas occupied by seed layer 346 and fill material 348 depicted in connection with PCM devices 300c and 300d.

The PCM device 300c may represent the PCM device 300b subsequent to forming a seed layer 346 on the liner 344. According to various embodiments, the seed layer 346 may facilitate deposition of a fill material 348 onto and between the PCM elements 316a, 316b, 316c. In some embodiments, the seed layer 346 may be composed of a dielectric material such as, for example, silicon oxide ($SiO_x$), where x represents a suitable relative quantity of oxygen to silicon. In some embodiments, the seed layer 346 may be deposited by plasma-enhanced ALD (PEALD). The seed layer 346 may be composed of other suitable materials and/or deposited using other suitable techniques in other embodiments.

According to various embodiments, the liner 344 may protect the PCM elements 316a, 316b, 316c from damage that may otherwise be caused by ozone or other similar strong oxidant used in connection with the PEALD deposition of the seed layer 346. For example, other liners may not sufficiently cover the sidewalls of the PCM elements 316a, 316b, 316c completely, which may allow the ozone to damage the PCM elements 316a, 316b, 316c and/or induce the creation of voids between PCM elements 316a, 316b, 316c (e.g., in a region between the PCM elements 316a, 316b, 316c near the wordline layer 330). The liner 344, on the other hand, may be configured to cover the entire sidewall surface of each of the PCM elements 316a, 316b, 316c and provide good adhesion for subsequent deposition of materials such as, for example, the seed layer 346.

The PCM device 300d may represent the PCM device 300c subsequent to depositing a fill material 348 on the seed layer 346 to fill regions between the PCM elements 316a, 316b, 316c. According to various embodiments, the fill material 348 may be composed of an electrically insulative material such as, for example, silicon oxide or other suitable material. The fill material 348 may be deposited using any suitable technique including, for example, by CVD (e.g., TEOS (tetraethylorthosilicate or tetraethoxysilane)+$O_3$ or TEOS+$O_2$ plasma).

Figure 4:
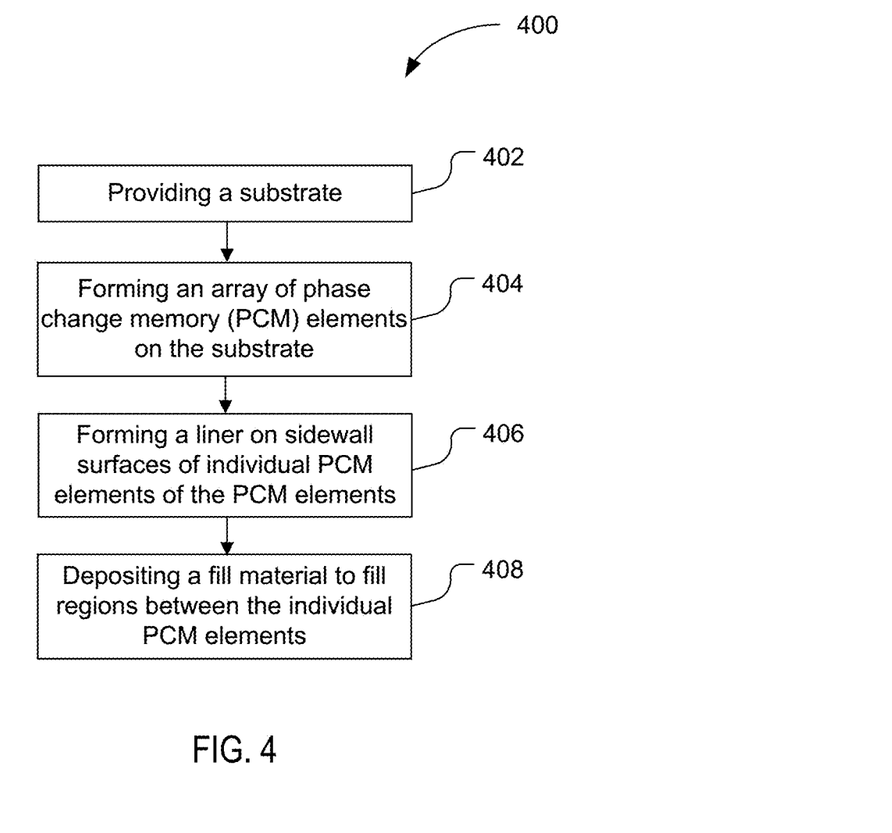
FIG. 4 is a flow diagram of a method of fabricating a PCM device, in accordance with some embodiments.

FIG. 4 is a flow diagram of a method 400 of fabricating a PCM device (e.g., PCM device 300a-d of FIG. 3), in accordance with some embodiments. The method 400 may comport with embodiments described in connection with FIG. 3 and vice versa.

At 402, the method 400 may include providing a substrate. The substrate may include, for example, a semiconductor substrate of a die such as, for example, a silicon substrate.

At 404, the method 400 may include forming an array of phase change memory (PCM) elements (e.g., PCM elements 316a-c of FIG. 3) on the substrate. In some embodiments, intervening structures and/or layers may be formed between the PCM elements and the substrate. For example, in one embodiment, a wordline layer (e.g., wordline layer 330 of FIG. 3) may be formed on the substrate and the PCM elements may be formed on the wordline layer.

The PCM elements may be formed by depositing a stack of layers and patterning them. For example, in some embodiments, the stack of layers may be formed by depositing a first layer (e.g., first layer 332 of FIG. 3) comprising carbon on a wordline layer (or other suitable underlying layer on the substrate), depositing a second layer (e.g., second layer 334 of FIG. 3) comprising a chalcogenide material on the first layer, depositing a third layer (e.g., third layer 336 of FIG. 3) comprising carbon on the second layer, depositing a fourth layer (e.g., fourth layer 338 of FIG. 3) comprising a chalcogenide material on the third layer and depositing a fifth layer (e.g., fifth layer 340 of FIG. 3) comprising carbon on the fourth layer. In some embodiments, a sixth layer (e.g., sixth layer 342 of FIG. 3) comprising a hardmask material may be formed on the fifth layer to facilitate patterning of the stack of layers to form discrete PCM elements.

At 406, the method 400 may include forming a liner (e.g., liner 344 of FIG. 3) on sidewall surfaces of individual elements of the PCM elements. The liner may be formed according to techniques described in connection with the PCM device 300b of FIG. 3. In some embodiments, the liner comprises at least aluminum (Al), silicon (Si) and oxygen (O). For example, in some embodiments, forming the liner may include depositing aluminum silicon oxide ($Al_xSi_yO_z$) by ALD or CVD where x, y and z represent suitable relative quantities of Al, Si and O, respectively. In one embodiment, the liner may be deposited by ALD such as, for example, a water-based process performed at a temperature less than 250° C.

In some embodiments, the liner may be formed to entirely cover sidewall and/or top surfaces of the individual PCM elements and the liner may have a uniform thickness. In some embodiments, the liner may be deposited directly on chalcogenide material of the individual PCM elements.

At 408, the method 400 may further include depositing a fill material (e.g., fill material 348 of FIG. 3) to fill regions between the individual PCM elements. In some embodiments, a seed layer (e.g., seed layer 346 of FIG. 3) may be deposited on the liner to facilitate deposition of the fill material. In other embodiments, the fill material may be deposited directly on the liner. In still other embodiments, the material of the liner may be deposited to provide the fill material and fill the regions between the individual PCM elements.

Figure 5:
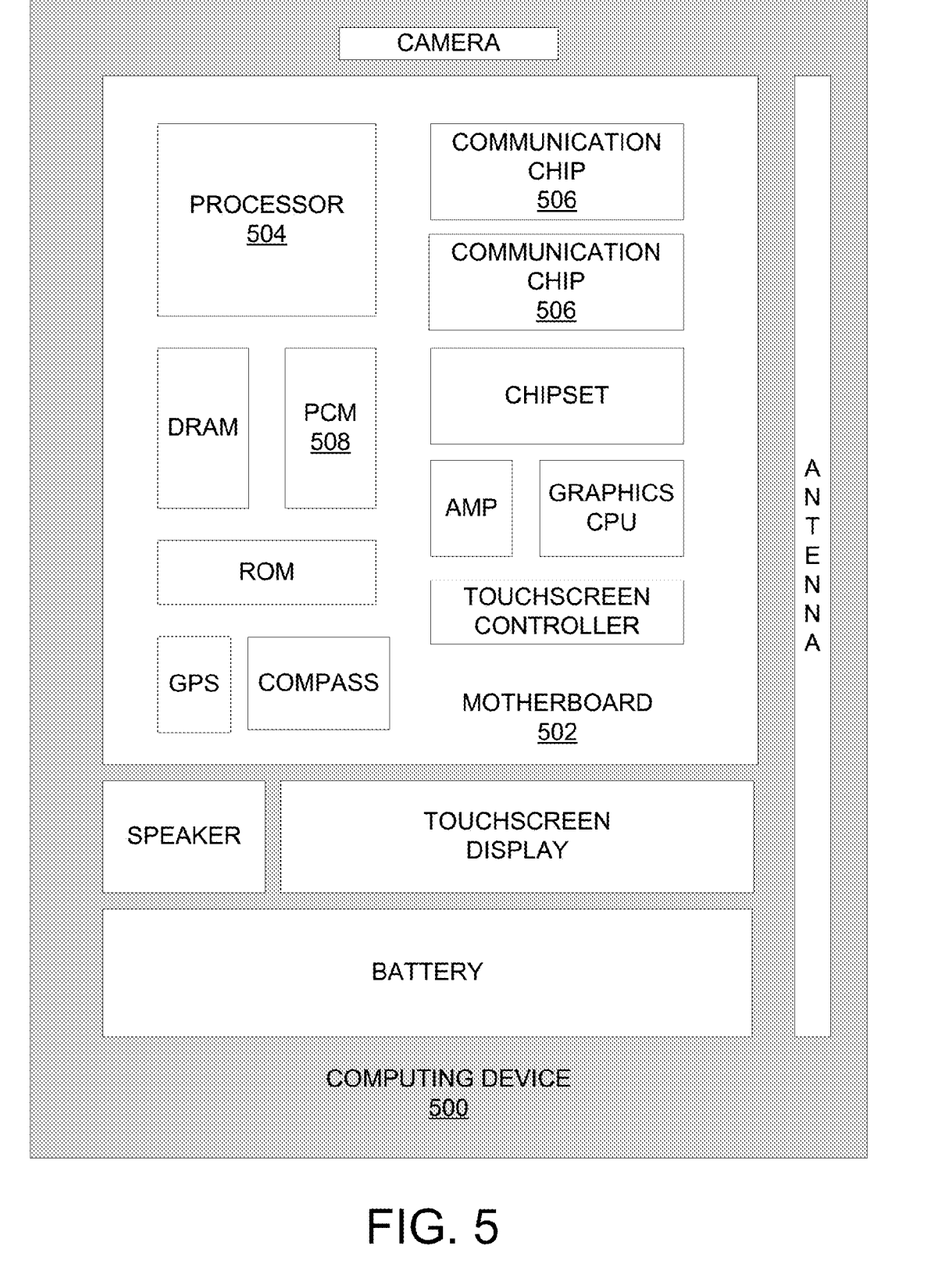
FIG. 5 schematically illustrates an example system that includes a PCM device in accordance with various embodiments described herein.

Embodiments of the present disclosure may be implemented into a system using any suitable hardware and/or software to configure as desired. FIG. 5 schematically illustrates an example system (e.g., a computing device 500) that includes a PCM device 508 (e.g., PCM device 300 of FIG. 3) in accordance with various embodiments described herein. The computing device 500 may house a board such as motherboard 502. The motherboard 502 may include a number of components, including but not limited to a processor 504 and at least one communication chip 506. The processor 504 may be physically and electrically coupled to the motherboard 502. In some implementations, the at least one communication chip 506 may also be physically and electrically coupled to the motherboard 502. In further implementations, the communication chip 506 may be part of the processor 504.

Depending on its applications, computing device 500 may include other components that may or may not be physically and electrically coupled to the motherboard 502. These other components may include, but are not limited to, volatile memory (e.g., DRAM), non-volatile memory (e.g., PCM (PCM 508) or ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

According to various embodiments, the PCM 508 may comport with embodiments described herein. For example, the PCM 508 may include a liner (e.g., liner 344 of FIG. 3) as described herein.

The communication chip 506 may enable wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 506 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 506 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 506 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 506 may operate in accordance with other wireless protocols in other embodiments.

The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

In various implementations, the computing device 500 may be mobile computing device, a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

EXAMPLES

According to various embodiments, the present disclosure describes an apparatus. Example 1 of an apparatus includes a substrate, an array of phase change memory (PCM) elements disposed on the substrate, wherein individual PCM elements of the array of PCM elements comprise a chalcogenide material, and a liner disposed on sidewall surfaces of the individual PCM elements, wherein the liner comprises aluminum (Al), silicon (Si) and oxygen (O). Example 2 may include the apparatus of Example 1, wherein the liner comprises aluminum silicon oxide ($Al_xSi_yO$) and x and y represent relative quantities of Al, Si and O, respectively. Example 3 may include the apparatus of Example 2, wherein y/(x+y) is equal to a value from 0.05 to 0.6. Example 4 may include the apparatus of any of Examples 1-3, wherein the liner is disposed directly on the chalcogenide material, covers the sidewall surfaces entirely and has a substantially uniform thickness. Example 5 may include the apparatus of Example 4, wherein the liner covers top surfaces of the individual PCM elements. Example 6 may include the apparatus of any of Examples 1-3, further comprising a wordline layer disposed on the substrate, wherein the individual PCM elements are disposed on the wordline layer. Example 7 may include the apparatus of Example 6, wherein the liner is disposed on the wordline layer between the individual PCM elements. Example 8 may include the apparatus of Example 6, wherein each individual PCM element comprises a first layer comprising carbon disposed on the wordline layer, a second layer comprising a first chalcogenide material disposed on the first layer, a third layer comprising carbon disposed on the second layer, a fourth layer comprising a second chalcogenide material disposed on the third layer and a fifth layer comprising carbon disposed on the fourth layer. Example 9 may include the apparatus of any of Examples 1-3, further comprising a seed layer disposed on the liner. Example 10 may include the apparatus of Example 9, further comprising a fill material disposed on the seed layer and configured to fill regions between the individual PCM elements.

According to various embodiments, the present disclosure describes a method. Example 11 of a method includes providing a substrate, forming an array of phase change memory (PCM) elements on the substrate, wherein individual PCM elements of the array of PCM elements comprise a chalcogenide material, and forming a liner on sidewall surfaces of the individual PCM elements, wherein the liner comprises aluminum (Al), silicon (Si) and oxygen (O). Example 12 may include the method of Example 11, wherein forming the liner comprises depositing aluminum silicon oxide the liner comprises aluminum silicon oxide ($Al_xSi_yO$) by atomic layer deposition (ALD) or chemical vapor deposition (CVD) and x and y represent relative quantities of Al, Si and O, respectively. Example 13 may include the method of Example 12, wherein forming the liner comprises depositing $Al_xSi_yO$ by ALD. Example 14 may include the method of Example 13, wherein the ALD process is a water-based process performed at a temperature less than 250° C. Example 15 may include the method of any of Examples 11-14, wherein forming the liner comprises depositing a material comprising Al, Si and O directly on the chalcogenide material and depositing the material covers the sidewall surfaces entirely with a substantially uniform thickness of the material. Example 16 may include the method of Example 15, wherein depositing the material covers top surfaces of the individual PCM elements. Example 17 may include the method of any of Examples 11-14, wherein forming the array of PCM elements comprises depositing a first layer comprising carbon on a wordline layer disposed on the substrate, depositing a second layer comprising a first chalcogenide material on the first layer, depositing a third layer comprising carbon on the second layer, depositing a fourth layer comprising a second chalcogenide material on the third layer, and depositing a fifth layer comprising carbon on the fourth layer. Example 18 may include the method of any of Examples 11-14, further comprising depositing a seed layer on the liner. Example 19 may include the method of Example 18, further comprising depositing a fill material on the seed layer to fill regions between the individual PCM elements.

According to various embodiments, the present disclosure described a system (e.g., a computing device). Example 20 of a system includes a circuit board and a die coupled with the circuit board, the die comprising a substrate, an array of phase change memory (PCM) elements disposed on the substrate, wherein individual PCM elements of the array of PCM elements comprise a chalcogenide material and a liner disposed on sidewall surfaces of the individual PCM elements, wherein the liner comprises aluminum (Al), silicon (Si) and oxygen (O). Example 21 may include the system of Example 20, wherein the system is a mobile computing device including one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A method, comprising:
    providing a substrate;
    disposing a wordline layer on the substrate;
    forming an array of phase change memory (PCM) elements directly on the wordline layer, wherein individual PCM elements of the array of PCM elements include an electrode layer directly coupled to the wordline layer and a chalcogenide material layer directly coupled to the electrode layer; and
    forming a liner directly on sidewall surfaces of the individual PCM elements and directly on the wordline layer between the individual PCM elements, wherein the liner comprises aluminum (Al), silicon (Si) and oxygen (O), the liner having a dielectric constant below a threshold, to reduce parasitic leakage associated with the wordline layer, wherein forming the liner includes depositing the liner by atomic layer deposition (ALD) at a temperature less than 250° C. to prevent damaging the chalcogenide material layer, including controlling Si content of the liner by adjusting an ALD cycle ratio n to m to prevent accumulating —Si—O—Si— and —O—Si—H groups on a surface of the liner during forming of the liner, wherein n represents a number of trimethyl aluminum/purge/$H_2$O/purge cycles, and m represents a number of tris-dimethyalamine silane/purge/$H_2$O/purge cycles, wherein a ratio of n to m is approximately 1 to 3.

2. The method of claim 1, wherein:
    forming the liner further includes depositing aluminum silicon oxide, wherein the liner comprises aluminum silicon oxide ($Al_xSi_yO$); and
    x and y represent relative quantities of Al, Si and O, respectively.

3. The method of claim 1, wherein:
    forming the liner comprises depositing a material comprising Al, Si and O directly on the chalcogenide material; and
    depositing the material covers the sidewall surfaces entirely with a substantially uniform thickness of the material.

4. The method of claim 3, wherein depositing the material covers top surfaces of the individual PCM elements.

5. The method of claim 1, wherein forming the array of PCM elements comprises:
    depositing the electrode layer comprising carbon on the wordline layer disposed on the substrate;
    depositing the chalcogenide material layer comprising a first chalcogenide material on the electrode layer;

depositing a third layer comprising carbon on the chalcogenide material layer;
depositing a fourth layer comprising a second chalcogenide material on the third layer; and
depositing a fifth layer comprising carbon on the fourth layer.

6. The method of claim 1, further comprising:
depositing a seed layer on the liner.

7. The method of claim 6, further comprising:
depositing a fill material on the seed layer to fill regions between the individual PCM elements.

* * * * *